United States Patent
You et al.

(10) Patent No.: US 9,171,853 B2
(45) Date of Patent: Oct. 27, 2015

(54) METHOD OF FABRICATING SEMICONDUCTOR DEVICE AND DEVICE FABRICATED THEREBY

(71) Applicant: SAMSUNG ELECTRONICS CO., LTD., Suwon-si, Gyeonggi-do (KR)

(72) Inventors: Jang-Hyun You, Seoul (KR); Hyeong Park, Hwaseong-si (KR); Bongtae Park, Seoul (KR); Jeehoon Han, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/200,610

(22) Filed: Mar. 7, 2014

(65) Prior Publication Data

US 2014/0252444 A1   Sep. 11, 2014

(30) Foreign Application Priority Data

Mar. 7, 2013  (KR) .................. 10-2013-0024622

(51) Int. Cl.
  *H01L 27/115*   (2006.01)
(52) U.S. Cl.
  CPC .... *H01L 27/11521* (2013.01); *H01L 27/11519* (2013.01); *H01L 27/11548* (2013.01); *H01L 27/11524* (2013.01)
(58) Field of Classification Search
  CPC .................................... H01L 27/11548

USPC .................................. 257/316, 321
See application file for complete search history.

(56) References Cited

U.S. PATENT DOCUMENTS

| | | |
|---|---|---|
| 7,151,040 B2 | 12/2006 | Tran et al. |
| 7,298,005 B2 | 11/2007 | Yoshikawa |
| 7,790,531 B2 | 9/2010 | Tran |
| 8,076,205 B2 | 12/2011 | Maekawa |
| 8,158,476 B2 | 4/2012 | Tran et al. |
| 8,183,148 B2 | 5/2012 | Aburada et al. |
| 8,216,938 B2 | 7/2012 | Lee et al. |
| 8,368,182 B2 | 2/2013 | Lee et al. |
| 8,461,053 B2 | 6/2013 | Chen et al. |
| 2009/0065956 A1 | 3/2009 | Colburn et al. |
| 2011/0062595 A1 | 3/2011 | Sim et al. |
| 2014/0252444 A1* | 9/2014 | You et al. ............... 257/315 |

FOREIGN PATENT DOCUMENTS

| | | |
|---|---|---|
| JP | 2006-156657 A | 6/2006 |
| JP | 2010-087263 A | 4/2010 |

* cited by examiner

*Primary Examiner* — Mark Prenty
(74) *Attorney, Agent, or Firm* — Lee & Morse, P.C.

(57) ABSTRACT

A semiconductor device includes a plurality of lines disposed on a semiconductor substrate, and remaining line patterns disposed spaced apart from the lines on extensions from the lines. The lines include first end-portions adjacent to the remaining line patterns. The remaining line patterns include second end-portions adjacent to the lines. The first end-portions and second end-portions are formed to have mirror symmetry with respect to each other.

8 Claims, 26 Drawing Sheets

METHOD OF FABRICATING SEMICONDUCTOR DEVICE AND DEVICE FABRICATED THEREBY

CROSS-REFERENCE TO RELATED APPLICATION

Korean Patent Application No. 10-2013-0024622, filed on Mar. 7, 2013, in the Korean Intellectual Property Office, and entitled: "Method of Fabricating Semiconductor Device and Device Fabricated Thereby," is incorporated by reference herein in its entirety.

BACKGROUND

1. Field

Example embodiments relate to a method of fabricating a semiconductor device and a semiconductor device fabricated thereby.

2. Description of the Related Art

Higher integration of semiconductor memory devices is desirable to satisfy consumer demands for superior performance and inexpensive prices.

SUMMARY

Embodiments are directed to a semiconductor device including a plurality of lines disposed on a semiconductor substrate, and remaining line patterns disposed spaced apart from the lines on extensions from the lines. The lines include first end-portions adjacent to the remaining line patterns. The remaining line patterns include second end-portions adjacent to the lines. The first end-portions and second end-portions are formed to have mirror symmetry with respect to each other.

Each of the first end-portions may have a width greater than the lines.

A sidewall slope of the first end-portions may be more gentle than a sidewall slope of the lines.

The semiconductor device may further include a device isolation layer disposed on the substrate to define a dummy active region and a cell active region. The dummy active region may be between the first end-portions and the second end-portions.

A width of the dummy active region may be greater than that of the cell active region.

The semiconductor device may further include dummy floating gates disposed between the lines and the dummy active region, and cell floating gates disposed between the lines and the cell active region.

At least some of adjacent ones of the dummy floating gates may be in contact with each other. All of the cell floating gates may be spaced apart from each other.

The remaining line patterns may be spaced apart from each other.

The remaining line patterns may further include third end-portions spaced apart from the second end-portions. Widths of the second and third end-portions may be greater than widths of the lines.

At least portions of the remaining line patterns may be connected to each other.

Embodiments are also directed to a method of fabricating a semiconductor device including forming a device isolation layer on a substrate to define a dummy active region and a cell active region, sequentially stacking an etch-target layer and a mask layer on the substrate, forming linear spacers and a spacer connecting portion, the linear spacers being spaced apart from each other on the mask layer and the spacer connecting portion connecting end-portions of the linear spacers, forming a mask pattern on the substrate to have a first opening partially exposing the linear spacers, the first opening being formed spaced apart from the spacer connecting portion, and removing portions of the linear spacers exposed by the first opening.

The first opening may overlap the dummy active region, in plan view.

The dummy active region may be formed to have a greater width than the cell active region.

The removing of the portions of the linear spacers exposed by the first opening may separate the linear spacers from the spacer connecting portion. The method may further include removing the mask pattern, and sequentially etching the mask layer and the etch-target layer using the linear spacers and the spacer connecting portion as an etch mask to form a line pattern and a connecting pattern overlapped by the linear spacers and the spacer connecting portion, respectively.

The mask pattern may include a second opening spaced apart from the first opening to expose the spacer connecting portion. The method may further include removing the portions of the linear spacers and the spacer connecting portion exposed by the first and second openings, respectively, to form a linear spacer portion and a remaining spacer line pattern spaced apart from each other, removing the mask pattern, and sequentially etching the mask layer and the etch-target layer using the linear spacer portion and the remaining spacer line pattern as an etch mask to form a line pattern and a remaining line pattern overlapped with the linear spacer portions and the remaining spacer line pattern.

Embodiments are also directed to a method of fabricating a semiconductor device, including forming a device isolation layer on a substrate to define dummy active regions and a cell active region, sequentially stacking an etch-target layer and a mask layer on the substrate, forming linear spacers and a spacer connecting portion, the linear spacers being spaced apart from each other on the mask layer and extending in first direction crossing the dummy active regions, the cell active region and the device isolation layer, and the spacer connecting portion connecting end-portions of the linear spacers in a first dummy active region of the dummy active regions, forming a mask pattern on the substrate, the mask pattern having a first opening extending in a second direction crossing the linear spacers, the first opening being spaced apart from the spacer connecting portion and exposing a section of the linear spacers, separating the linear spacers from the spacer connecting portion by removing the section of the linear spacers exposed by the first opening, removing the mask pattern, and sequentially etching the mask layer and the etch-target layer using the linear spacers as a mask to form a line pattern overlapped by the linear spacers.

The first opening may overlap a second dummy active region of the dummy active regions.

Sequentially etching the mask layer and the etch-target layer may further include etching using the spacer connecting portion as an etch mask to form a connecting pattern.

Forming the mask pattern may further include forming a second opening spaced apart from the first opening, the second opening extending in the second direction crossing the spacer connecting portion and exposing a section of the spacer connecting portion. The method may further include forming a residual spacer line portion by removing the section of the spacer connecting portion exposed by the second opening, and sequentially etching the mask layer and the etch-target layer further includes etching using the residual spacer line portion as an etch mask to form a connecting pattern.

The second opening may overlap the first dummy active region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
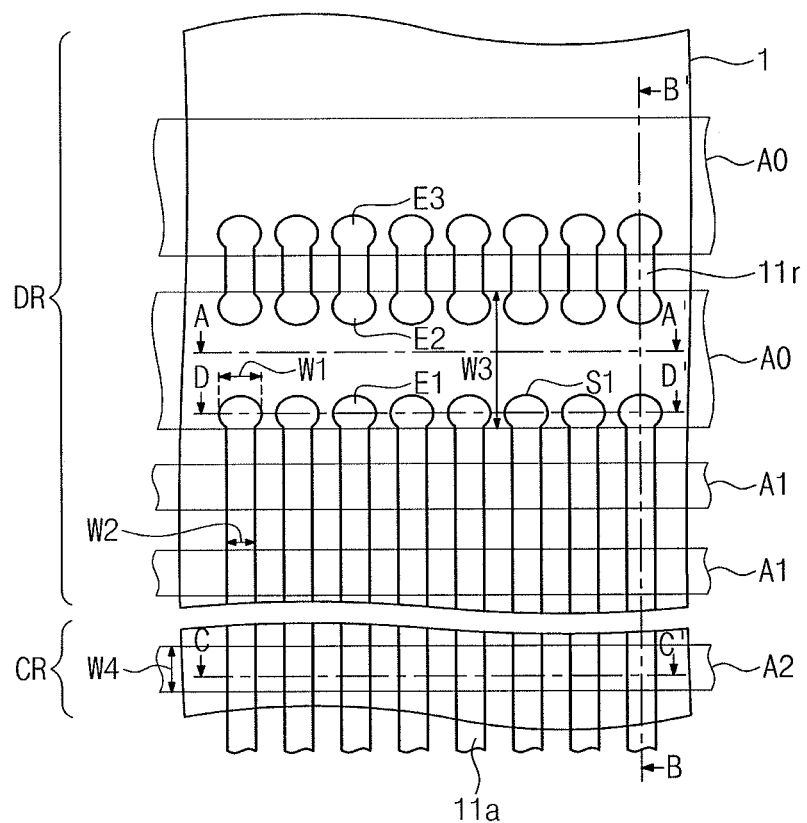
FIG. 1A illustrates a plan view of a semiconductor device according to example embodiments.
Figure 1B:
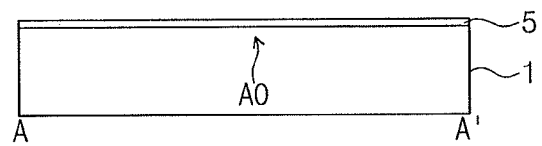
FIGS. 1B through 1E illustrate sectional views taken along lines A-A', B-B', C-C', and D-D', respectively, of FIG. 1A.
Figure 1C:
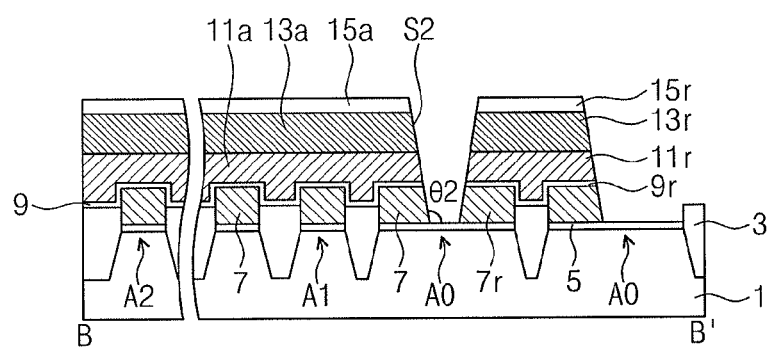

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1D:
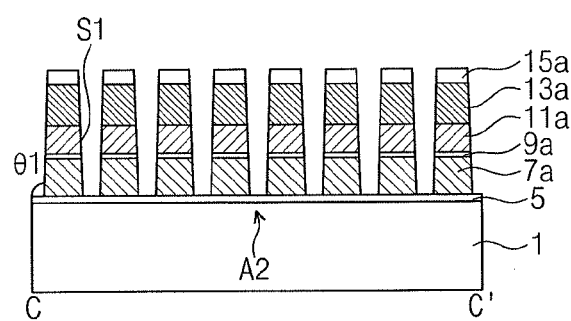

FIG. 1A illustrates a plan view of a semiconductor device according to example embodiments. FIGS. 1B through 1E illustrate sectional views taken along lines A-A', B-B', C-C', and D-D', respectively, of FIG. 1A. FIG. 1F illustrates a sectional view taken along line D-D' of FIG. 1A to depict a semiconductor device according to a modification of example embodiments.

Referring to FIGS. 1A through 1E, a device isolation layer 3 may be provided on a substrate 1 to define dummy active regions A0 and A1 and cell active regions A2. The substrate 1 may include a dummy region DR and a cell region CR. The dummy active regions A0 and A1 may be provided on the dummy region DR, and the cell active regions A2 may be provided on the cell region CR. The dummy active regions A0 and A1 may include first dummy active regions A0 and second dummy active regions A1. Memory cells to be provided on the dummy active regions A0 and A1 may not be used to store data (or serve as dummy cells). Memory cells to be provided on the cell active regions A2 may be used to store data. In example embodiments, the second dummy active regions A1 may be formed to have substantially the same width as a width W4 of the cell active region A2. A width W3 of the first dummy active region A0 may be greater than the width W4 of the cell active regions A2. In the present embodiment, the number of the first dummy active regions A0 may be two or more. The first dummy active regions A0 may be disposed at the outermost region of the cell region CR or spaced apart from the cell active regions A2 by the second dummy active regions A1 interposed therebetween.

The device isolation layer 3 may have a top surface that is higher than a top surface of the substrate 1. A plurality of word lines 11a may be formed on the substrate 1 to cross the active regions A0, A1, and A2. Remaining word line patterns 11r may be provided spaced apart from and extending in a same direction as the word lines 11a. The remaining word line patterns 11r may be formed to cross over the first dummy active regions A0. A floating gate pattern 7 may be disposed between the word lines 11a and the active regions A1 and between the word lines 11a and the active regions A2. The floating gate pattern 7 may have a top surface that is higher than the top surface of the device isolation layer 3. The word line 11a may be formed to face the top surface as well as side surfaces of the floating gate pattern 7. Accordingly, it may be possible to increase a capacitance between the word line 11a and the floating gate pattern 7 and thereby improve operation characteristics of the device. In example embodiments, a tunnel insulating layer 5 may be interposed between the floating gate pattern 7 and the substrate 1. A blocking insulating layer 9 may be interposed between the floating gate pattern 7 and the word line 11a. A remaining floating gate pattern 7r may be interposed between the remaining word line pattern 11r and the first dummy active region A0. A remaining blocking layer 9r may be interposed between the remaining floating gate pattern 7r and the remaining word line pattern 11r.

The word line 11a may include a first end-portion E1 adjacent to the remaining word line pattern 11r. The remaining word line pattern 11r may include a second end-portion E2 adjacent to the first end-portion E1 and a third end-portion E3 spaced apart from the second end-portion E2. The first end-portion E1 and the second end-portion E2 may be formed to have mirror symmetry with respect to a line interposed therebetween. The first end-portion E1 may have a width W1 that is greater than a width W2 of the word line 11a. A first angle θ1 between a sidewall S1 of the word line 11a that is positioned between the word lines 11a, and a top surface of the substrate 1 may be smaller than a second angle θ2 between a sidewall S2 of the first end-portion E1 and the top surface of the substrate 1. The second angle is much bigger than 90° and the first angle is close to about 90°. For example, the sidewall slope of the sidewall of the first end-portion E1 may be more gentle (less steep) than the sidewall slope of the lines 11a. The second end-portions E2 may be spaced apart from each other, and the third end-portions E3 may be spaced apart from each other. The remaining word line patterns 11r may be spaced apart from each other. Accordingly, during a subsequent cleaning process, a cleaning solution for removing an impurity or by-product can be supplied without interruption. As a result, it may be possible to realize a highly-reliable semiconductor device.

Figure 1E:
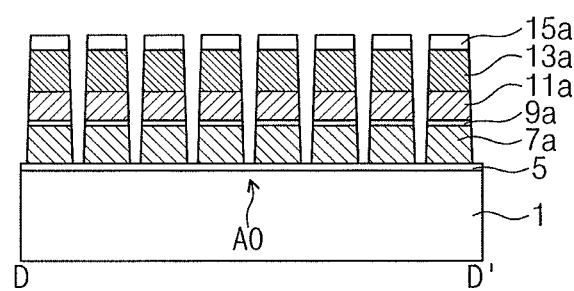
Figure 1F:
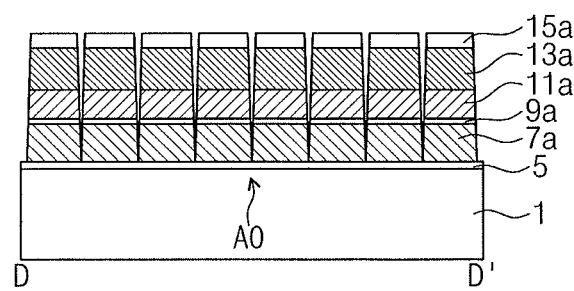
FIG. 1F illustrates a sectional view taken along line D-D' of FIG. 1A to illustrate a semiconductor device according to a modification of example embodiments.
Figure 2A:
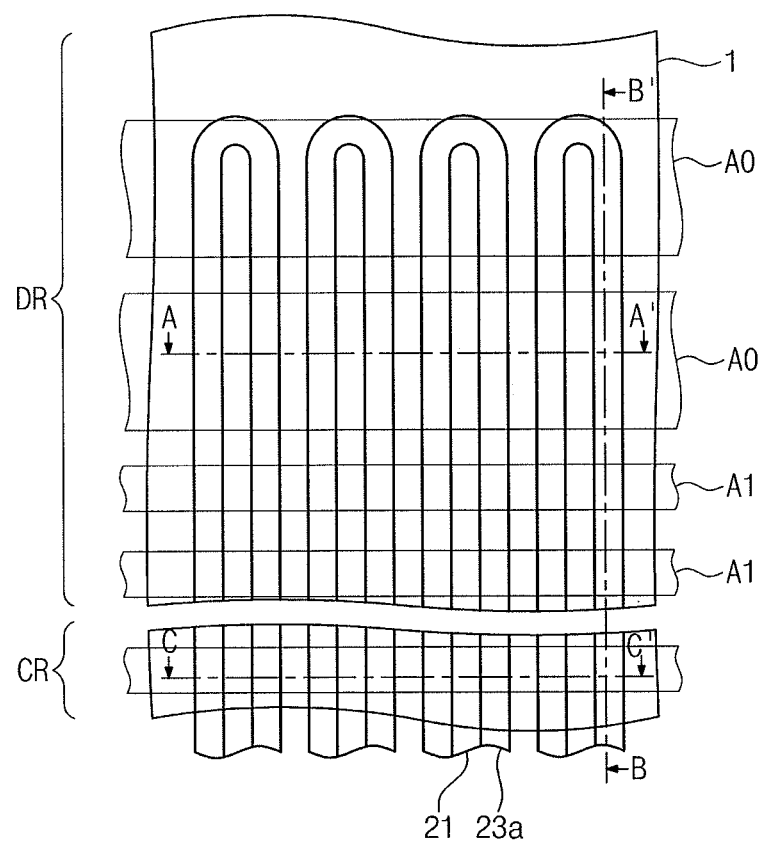
FIGS. 2A, 3A, 4A, and 5A illustrate plan views depicting stages of a method of fabricating a semiconductor device illustrated in FIG. 1A.
Figure 2B:
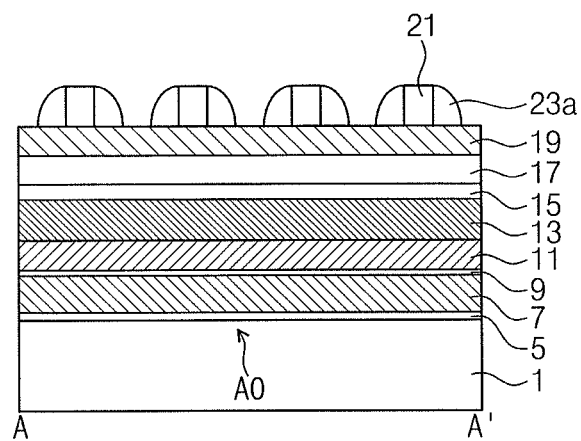
FIGS. 2B, 3B, 4B, 5B, 6A, 7A, and 8A illustrate sectional views depicting stages of a method of fabricating a semiconductor device having the section illustrated in FIG. 1B.
Figure 2C:
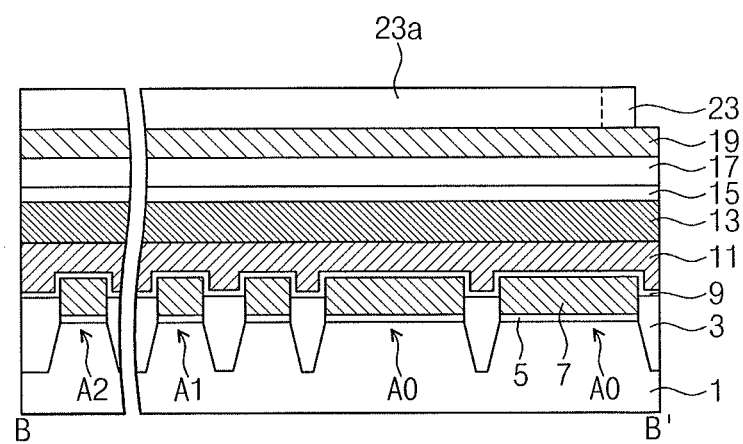
FIGS. 2C, 3C, 4C, 5C, 6B, 7B, and 8B illustrate sectional views depicting stages of a method of fabricating a semiconductor device having the section illustrated in FIG. 1C.
Figure 2D:
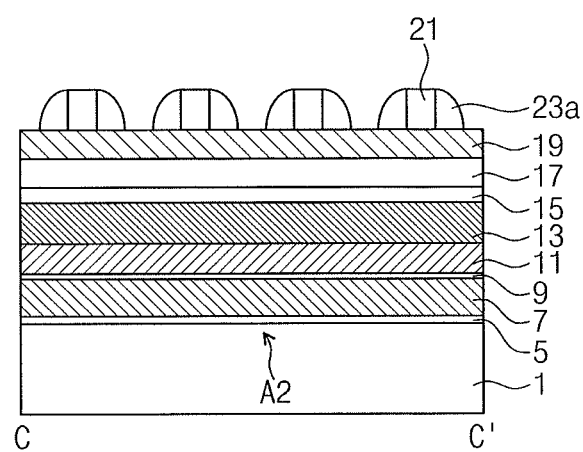
FIGS. 2D, 3D, 4D, 5D, 6C, 7C, and 8C illustrate sectional views depicting stages of a method of fabricating a semiconductor device having the section illustrated in FIG. 1D.
Figure 3A:
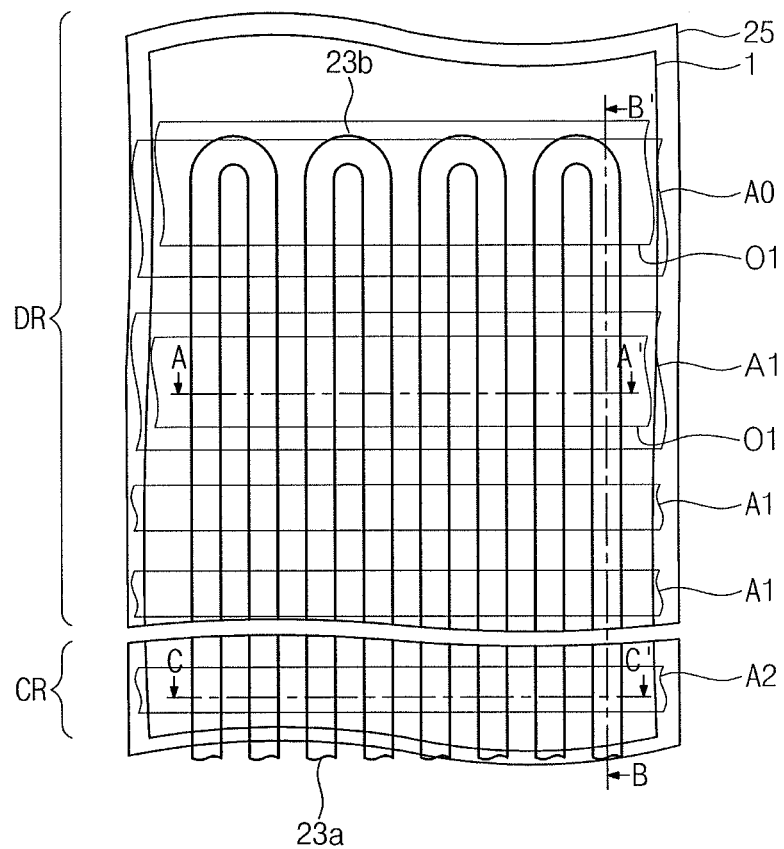
Figure 3B:
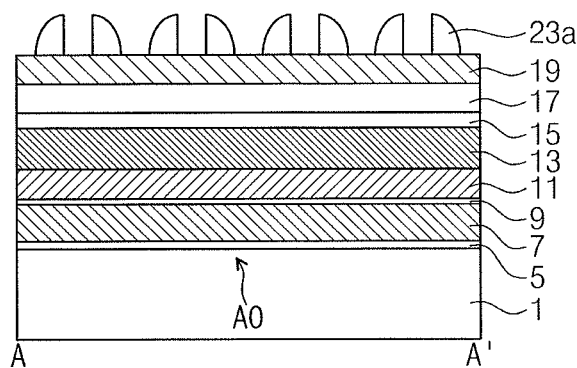
Figure 3C:
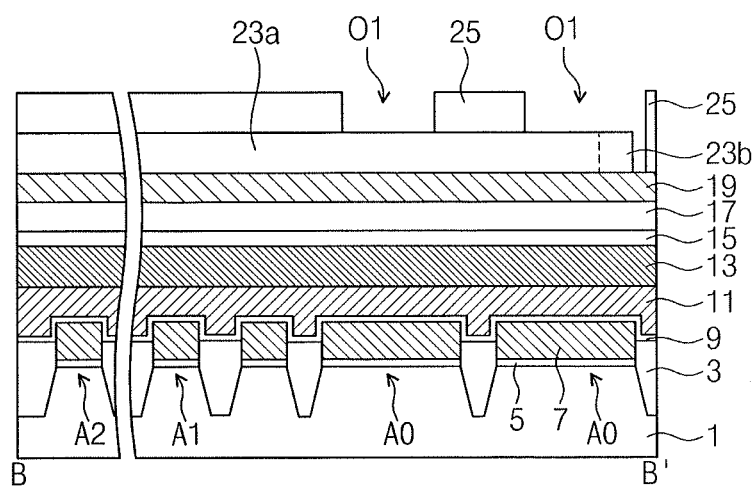
Figure 3D:
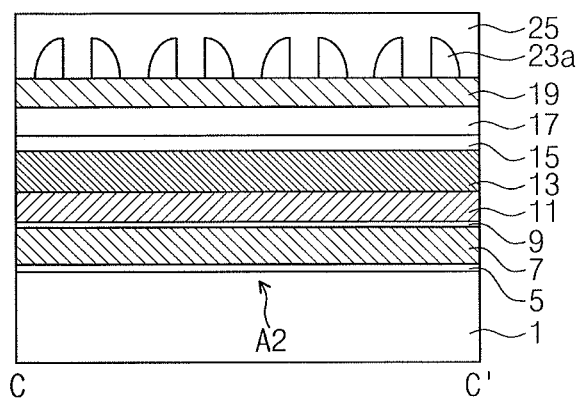
Figure 4A:
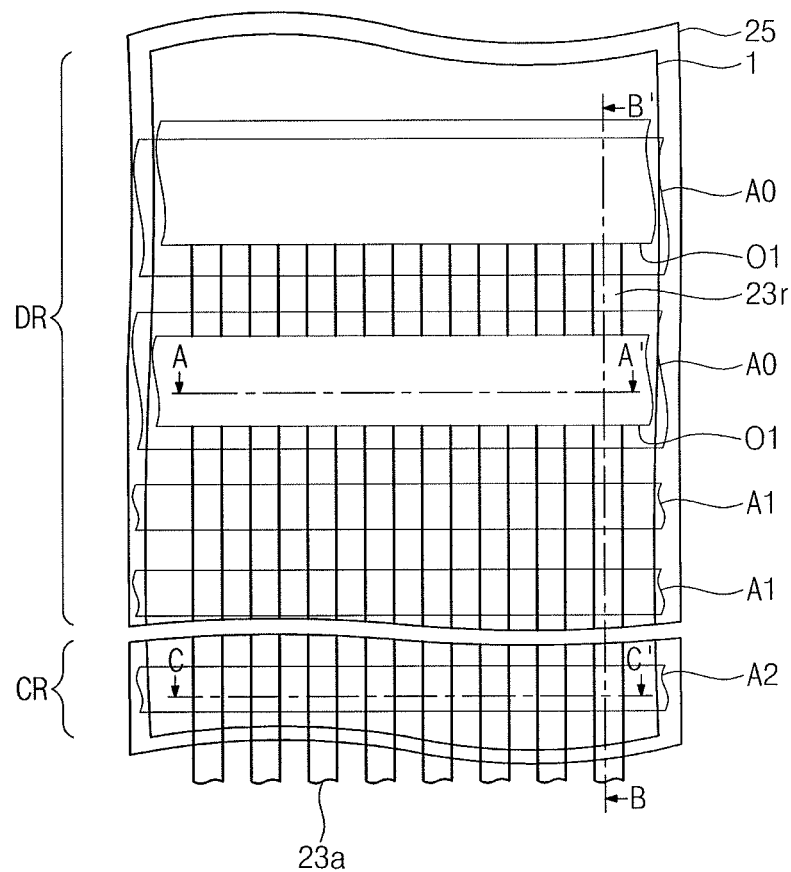
Figure 4B:
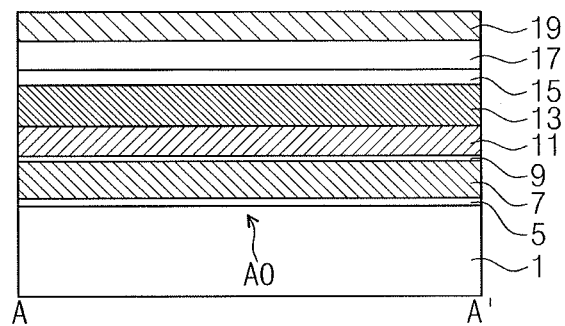
Figure 4C:
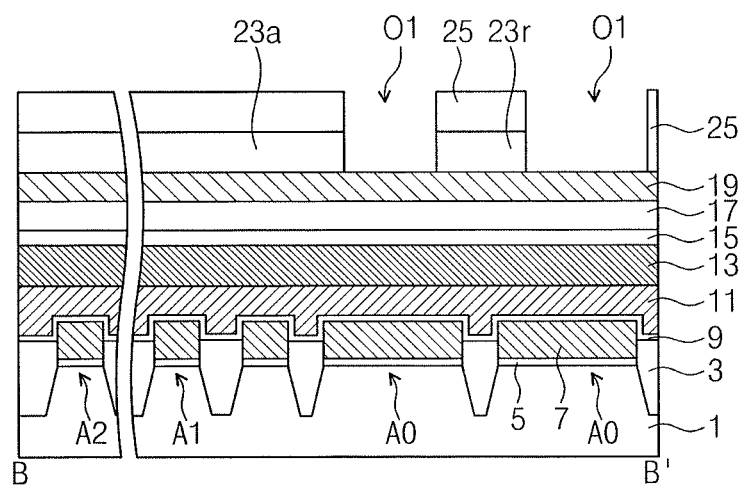
Figure 4D:
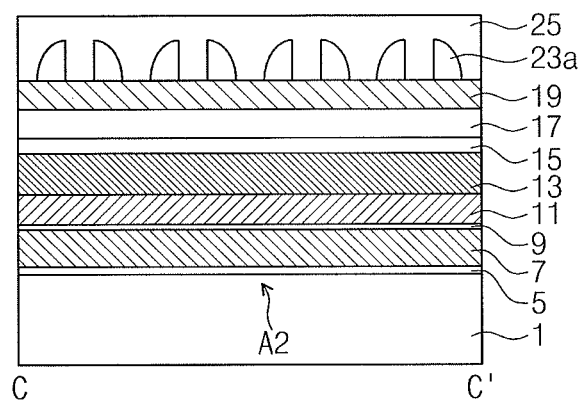
Figure 5A:
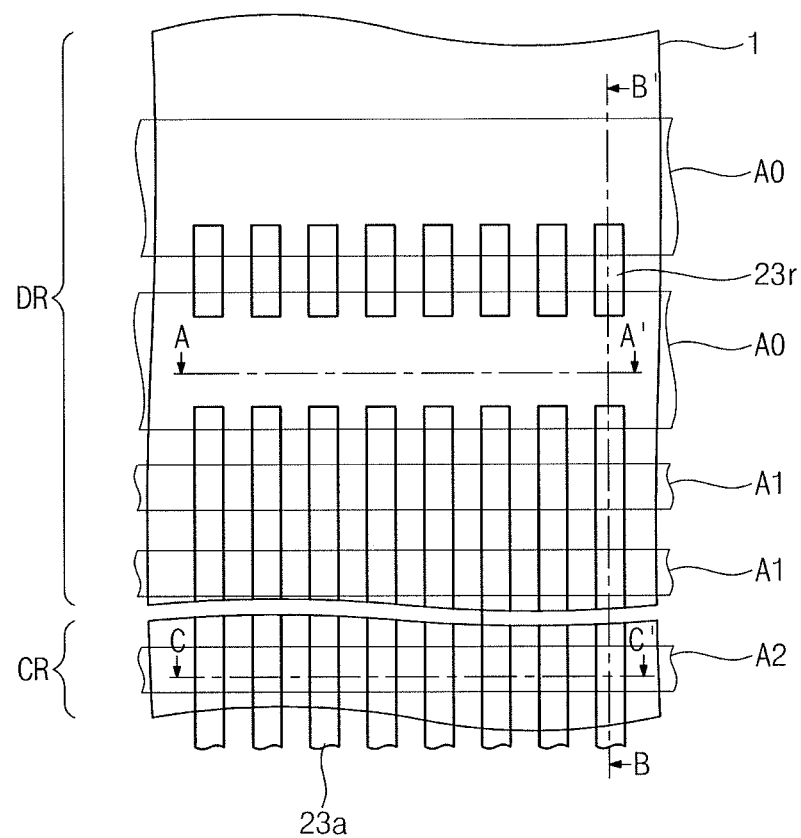
Figure 5B:
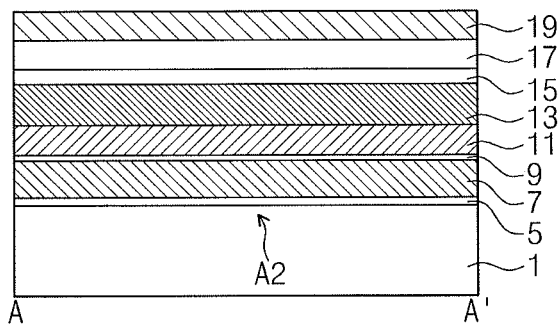
Figure 5C:
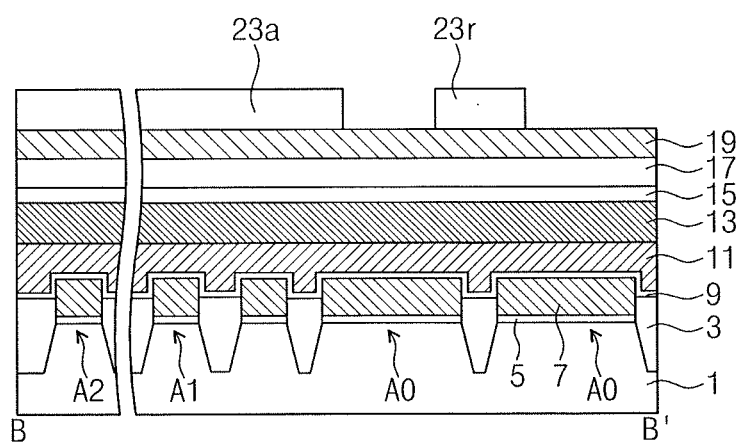
Figure 5D:
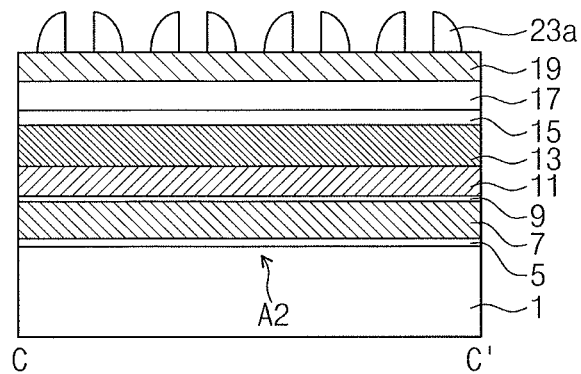
Figure 6A:
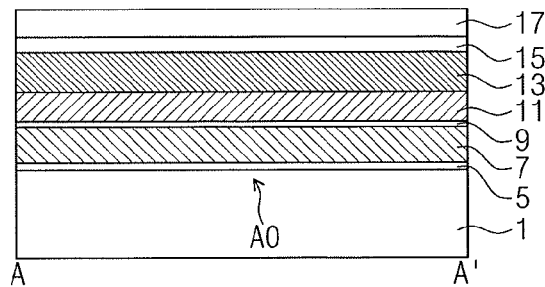
Figure 6B:
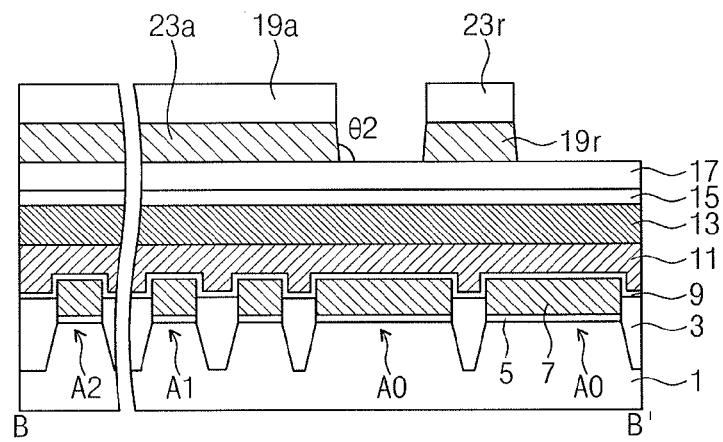
Figure 6C:
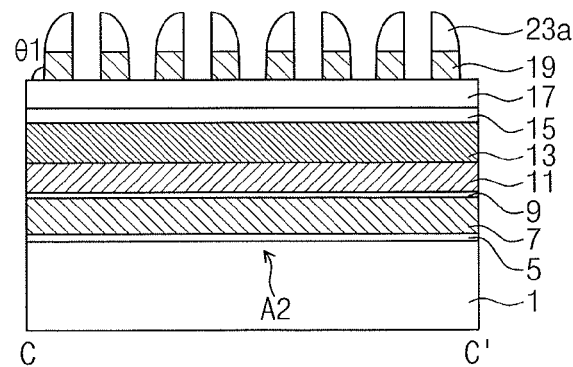
Figure 7A:
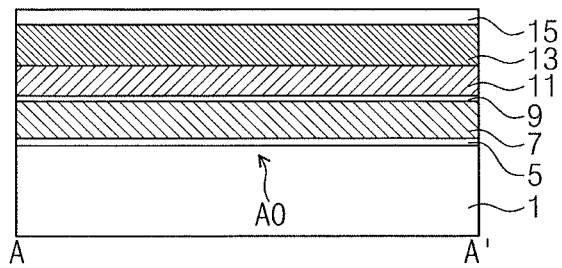
Figure 7B:
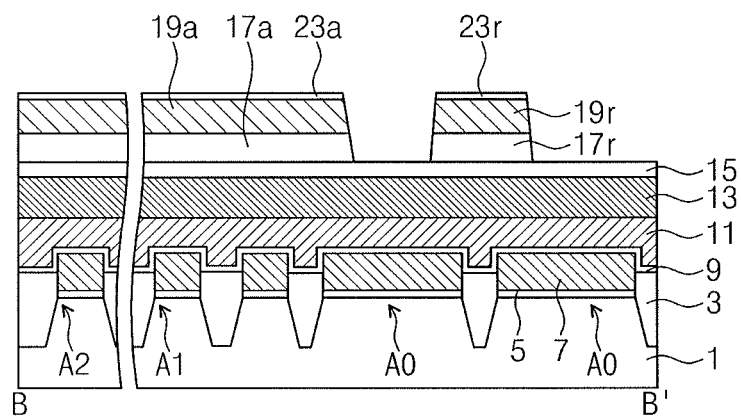
Figure 7C:
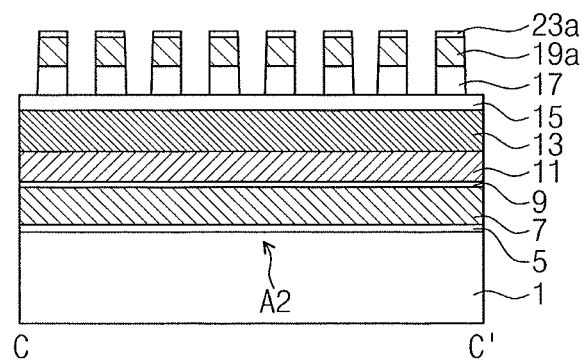
Figure 8A:
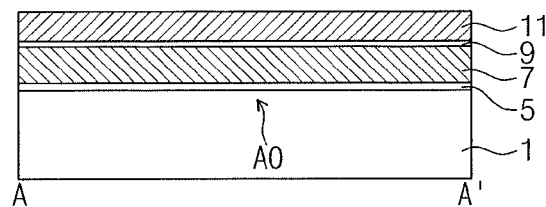
Figure 8B:
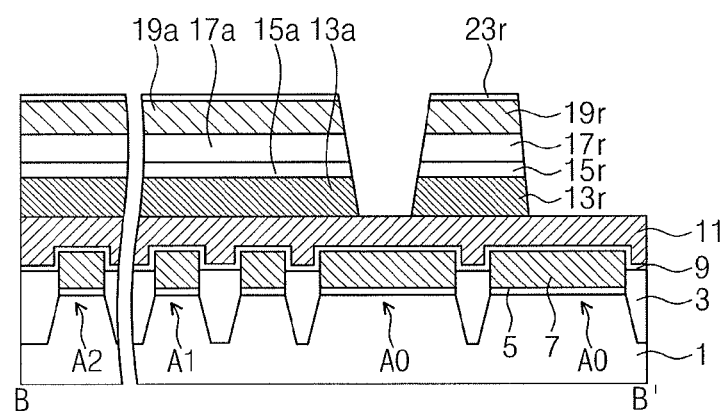
Figure 8C:
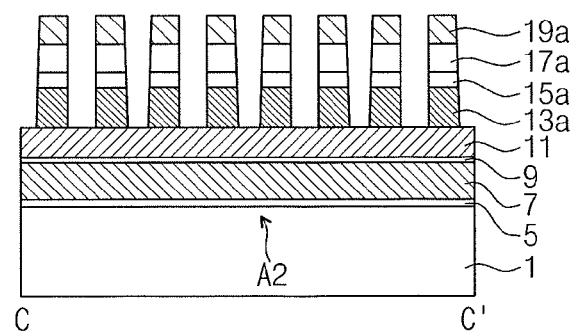

Below the first end-portions E1, the floating gate patterns 7 may be spaced apart from each other, as shown in FIG. 1E, or may be in contact with each other, as shown in FIG. 1F. Although the floating gate patterns 7 below the first end-portions E1 may be connected to each other as shown in FIG. 1F, such connections of the floating gate patterns 7 may not result in a malfunction of the device, because the first end-portions E1 are positioned on the dummy region DR. In addition, as shown in FIG. 1D, the floating gate patterns 7 adjacent to the cell region CR may be spaced apart from each other.

In example embodiments, all of the floating gate patterns 7, the remaining floating gate pattern 7r, the word line 11a, and the remaining word line pattern 11r may be formed of the same material, for example, a doped or undoped polysilicon layer. The tunnel insulating layer 5 may be formed of a silicon oxide layer. The blocking insulating layer 9 and the remaining blocking insulating layer 9r may be formed as a triple-layer including a silicon oxide layer, a silicon nitride layer, and a silicon oxide layer or a high-k dielectric layer.

Metal-containing layers 13a and 13r may be provided on the word line 11a and the remaining word line pattern 11r, respectively. In example embodiments, the metal-containing layer 13a and 13r may include a tungsten layer and/or a tungsten silicide layer. Capping patterns 15a and 15r may be provided on the metal-containing layers 13a and 13r, respectively.

Source/drain regions may be provided in portions of the substrate 1 located between the word lines 11a. The plurality of word lines 11a may each constitute a unit cell string, and at least one string selection line and at least one ground selection line may be provided at end portions, respectively, of the cell string.

According to the present embodiment, the semiconductor device may be configured to prevent bridging from occurring between the word lines 11a. Accordingly, it may be possible to prevent the device from malfunctioning.

FIGS. 2A, 3A, 4A, and 5A illustrate plan views depicting stages of a method of fabricating the semiconductor device illustrated in FIG. 1A. FIGS. 2B, 3B, 4B, 5B, 6A, 7A, and 8A illustrate sectional views depicting stages of a method of fabricating a semiconductor device having the section illustrated in FIG. 1B. FIGS. 2C, 3C, 4C, 5C, 6B, 7B, and 8B illustrate sectional views depicting stages of a method of fabricating a semiconductor device having the section illustrated in FIG. 1C. FIGS. 2D, 3D, 4D, 5D, 6C, 7C, and 8C illustrate sectional views depicting stages of a method of fabricating a semiconductor device having the section illustrated in FIG. 1D.

Referring to FIGS. 2A through 2D, the tunnel insulating layer 5, and the floating gate layer 7 may be sequentially stacked on the substrate 1 including the dummy region DR and the cell region CR. The floating gate layer 7, the tunnel insulating layer 5, and the substrate 1 may be partially etched to form trenches. An insulating layer may be formed to fill the trenches, and then the insulating layer may be recessed to form the device isolation layers 3. The floating gate layer 7 may be formed of a doped or undoped polysilicon. As the result of the formation of the device isolation layers 3, the first and second dummy active regions A0 and A1 and the cell active regions A2 may be delimited. In example embodiments, the first dummy active regions A0 may be formed to be wider than the cell active regions A2 and the second dummy active regions A1.

Next, a blocking insulating layer 9, a word line layer 11, a metal-containing layer 13, a capping layer 15, a first mask layer 17, and a second mask layer 19 may be sequentially stacked on the substrate 1. The word line layer 11 may be formed of a doped or undoped polysilicon. The metal-containing layer 13 may be formed of, for example, tungsten, and/or tungsten silicide. The capping layer 15 may be formed of, for example, a silicon nitride layer. The first mask layer 17 may be formed of, for example, at least one oxide. The second mask layer 19 may be formed of, for example, polysilicon.

Next, a plurality of line-shaped first photoresist patterns 21 may be formed on the second mask layer 19. Spacers 23a and 23b may be formed to cover sidewalls of the first photoresist patterns 21. The spacers 23a and 23b may be formed of, for example, a silicon oxide. The spacers 23a and 23b may be formed to entirely cover the sidewalls of the first photoresist patterns. Accordingly, the spacers 23a and 23b may be formed to have a closed loop shape. The spacers 23a and 23b may include linear spacer portions 23a covering both sidewalls of the line-shaped first photoresist pattern 21 and a spacer connecting portion 23b covering an end-portion of the first photoresist pattern 21. The spacer connecting portion 23b may be formed to connect the linear spacer portions 23a to each outer.

Referring to FIGS. 3A through 3D, the first photoresist pattern 21 may be removed by, for example, an ashing process. A second photoresist pattern 25 may be formed to have a plurality of openings θ1 that overlap with the first dummy active regions A0, respectively, and are spaced apart from each other. The openings θ1 may be formed to expose the spacer connecting portion 23b and a portion of the linear spacer portion 23a adjacent thereto. The remaining portion of the linear spacer portion 23a may be covered with the second photoresist pattern 25.

Referring to FIGS. 4A through 4D, a trimming process may be performed to selectively remove the spacer connecting portion 23b and the portion of the linear spacer portion 23a adjacent thereto exposed by the openings θ1. Accordingly, a remaining spacer pattern 23r may be formed between the openings θ1.

Referring to FIGS. 5A through 5D, the second photoresist pattern 25 may be removed by an ashing process, and thus, top surfaces of the linear spacer portion 23a, the remaining spacer pattern 23r, the second mask layer 19 may be exposed.

Referring to FIGS. 1A and 6A through 6C, the second mask layer 19 may be etched using the linear spacer portions 23a and the remaining spacer patterns 23r as an etch mask to form a second mask line pattern 19a and a remaining second mask pattern 19r. A space between the linear spacer portions 23a may be different from a space between the linear spacer portion 23a and the remaining spacer pattern 23r and pattern densities of the linear spacer portions 23a and the remaining spacer pattern 23r may be different from each other. Accordingly, there may be a spatial variation in the etching of the second mask layer 19. For example, an etch-loading effect may occur at end-portions of the linear spacer portion 23a and the remaining spacer patterns 23r. For instance, a first angle θ1 between a sidewall of the second mask line pattern 19a and the first mask layer 17 may be smaller than a second angle θ2 between a sidewall of the end-portion of the remaining second mask pattern 19r and the first mask layer 17. The second angle may be much bigger than 90° and the first angle may be almost close to about 90°. As the underlying layers 15, 13, 11, 9, and 7 are sequentially etched, the angles θ1 and θ2 may be transferred downward.

Referring to FIGS. 1A, and 7A through 7C, the first mask 17 may be etched using the second mask patterns 19a and 19r as etch mask to form first mask patterns 17a and 17r. In the case where the linear spacer portion 23a and the remaining spacer patterns 23r are formed of the same material (e.g., oxide) as the first mask 17, they may be removed or etched during the etching of the first mask 17.

Referring to FIGS. 1A, and 8A through 8C, the capping layer 15 and the metal-containing layer 13 may be sequentially etched using the second mask patterns 19a and 19r as an etch mask to form the capping patterns 15a and 15r and the metal-containing patterns 13a and 13r.

Thereafter, the word line layer 11, the blocking insulating layer 9, and the floating gate layer 7 may be sequentially patterned using the second and first mask patterns 19a, 19r, 17a, and 17r an etch mask, thereby forming the word line 11a, the remaining word line pattern 11r, and the floating gate patterns 7 and 7r, as shown in FIGS. 1A through 1E. In example embodiments, during the patterning process, the second and first mask patterns 19a, 19r, 17a, and 17r may be removed or etched to expose top surfaces of the capping patterns 15a and 15r.

If, in the trimming process, only the spacer connecting portion 23b is removed and the portion of the linear spacer portion 23a is not removed, the remaining spacer pattern 23r will not be formed. In this case, a variation in pattern density may be larger at the end-portion of the linear spacer portion 23a than between the linear spacer portions 23a, and thus, the angle θ2 between the sidewall of the end-portion of the linear spacer portion 23a and the first mask layer 17 may become greater than the second angle θ2 in the example embodiments. As the result of the downward transfer of the angles θ1 and θ2, the lower the position of a pattern, the wider the pattern. By contrast, according to example embodiments, since the second angle θ2 may be relatively small (approaching to about 90°), the downward enlargement in pattern width may be suppressed. Accordingly, it is possible to prevent a bridging between the patterns from occurring.

In addition, the end-portions E1-E3 may be formed on the first dummy active region A0 to have a relatively large width. Accordingly, it may be possible to prevent the occurrence of the bridge more effectively.

Figure 9:
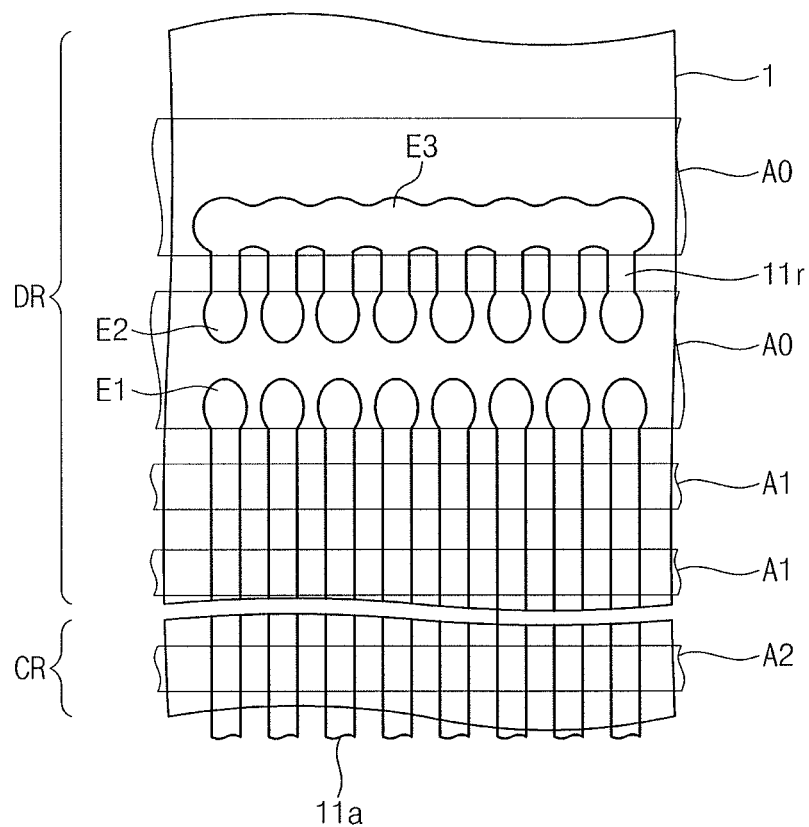
FIG. 9 illustrates a plan view of a semiconductor device according to other example embodiments.

FIG. 9 illustrates a plan view of a semiconductor device according to other example embodiments.

Referring to FIG. 9, the third end-portions E3 of the remaining word line patterns 11r may be connected to each other. This may result from a low density of patterns in a region adjacent to the third end-portions E3. For example, the etch-loading effect may occur increasingly in the region adjacent to the third end-portions E3, and this may result in the connection between the remaining word line patterns 11r. Except for this difference, the semiconductor device according to other example embodiments may be configured to have substantially the same or similar features as those of the previous embodiments.

Figure 10A:
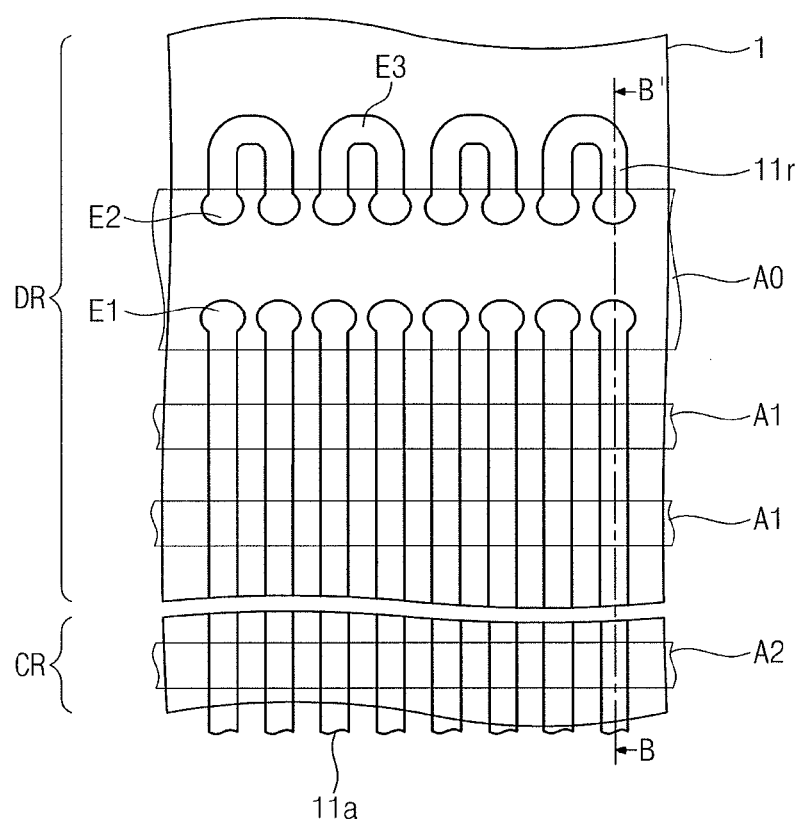
FIG. 10A illustrates a plan view of a semiconductor device according to other example embodiments.
Figure 10B:
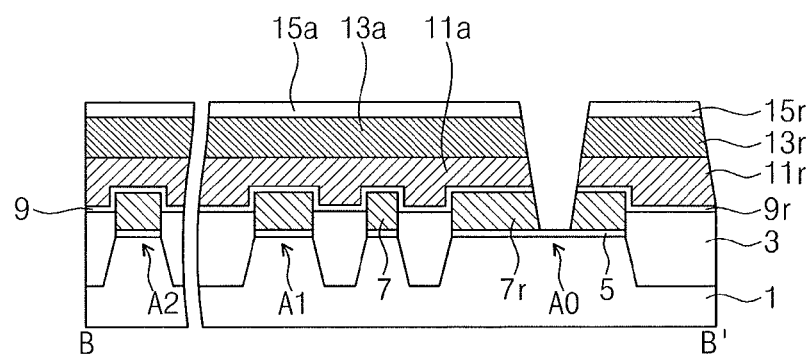
FIG. 10B illustrates a sectional view taken along line B-B' of FIG. 10A.

FIG. 10A illustrates a plan view of a semiconductor device according to other example embodiments. FIG. 10B illustrates a sectional view taken along line B-B' of FIG. 10A.

Referring to FIGS. 10A and 10B, according to other example embodiments, the semiconductor device may be configured in such a way that the number of the first dummy active regions A0 is one. Further, the first dummy active region A0 may be spaced apart from the third end-portion E3 of the remaining word line pattern 11r. An adjacent pair of the remaining word line patterns 11r may include the third end-portions E3 that are connected to each other to have a 'U'-shaped structure. Except for this difference, the semiconductor device according to other example embodiments may be configured to have substantially the same or similar features as those of the previous embodiments.

Figure 11A:
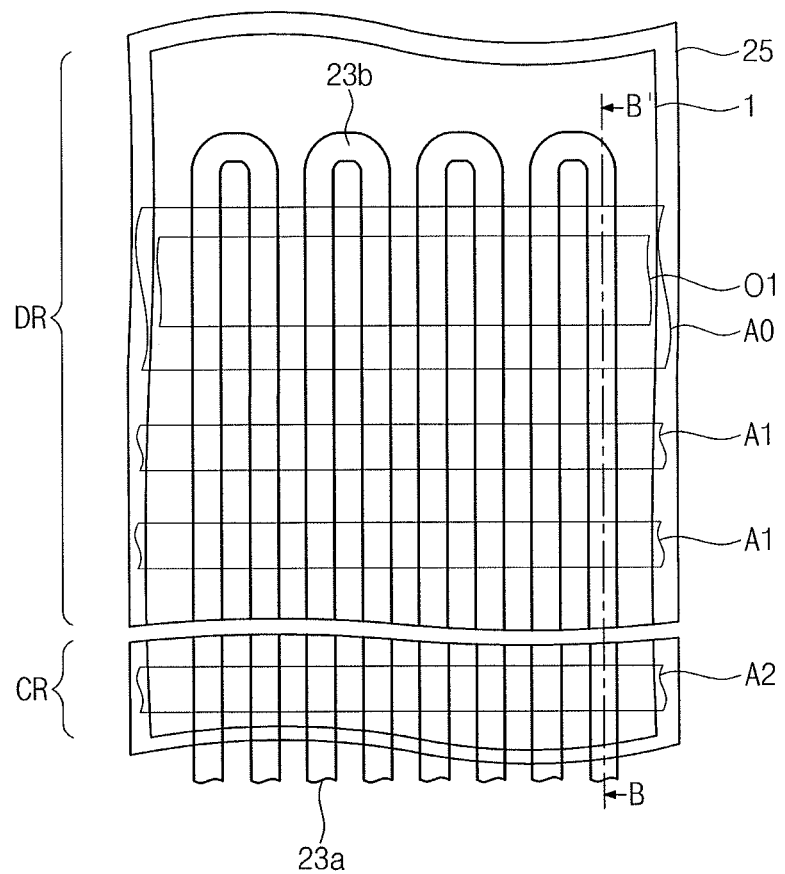
FIG. 11A illustrates a plan view illustrating a method of fabricating a semiconductor device illustrated in FIG. 10A.
Figure 11B:
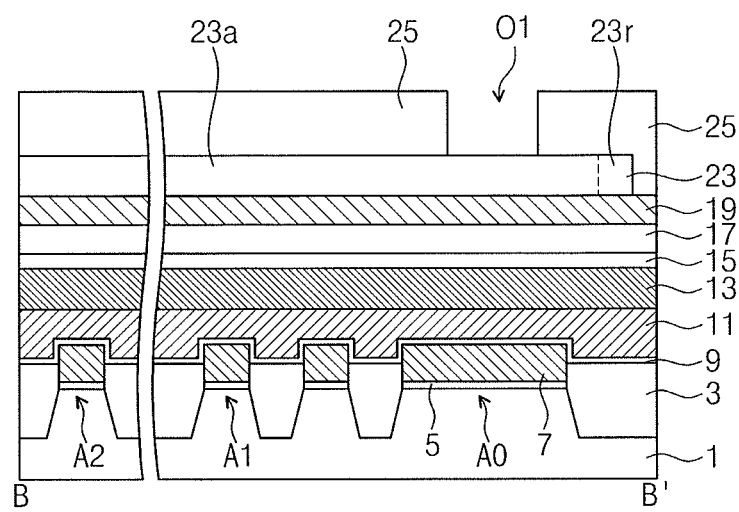
FIG. 11B illustrates a sectional view illustrating a method of fabricating a semiconductor device illustrated in FIG. 10B.

FIG. 11A illustrates a plan view illustrating a method of fabricating a semiconductor device of FIG. 10A. FIG. 11B illustrates a sectional view illustrating a method of fabricating a semiconductor device of FIG. 10B.

Referring to FIGS. 11A and 11B, as previously described in the example embodiments, the blocking insulating layer 9, the word line layer 11, the metal-containing layer 13, the capping layer 15, the first mask layer 17, the second mask layer 19, the linear spacer portion 23a, and the spacer connecting portion 23r may be formed on the substrate 1 including the first dummy active region A0, the second dummy active regions A1, and the cell active regions A2. Here, the number of the first dummy active regions A0 may be one. Next, the second photoresist pattern 25 may be formed to have an opening θ1. In example embodiments, the opening θ1 may be formed to expose a portion of the linear spacer portion 23a spaced apart from the spacer connecting portion 23r.

Thereafter, as previously described in the example embodiments, the portion of the linear spacer portion 23a exposed by the opening θ1 may be removed. The second photoresist pattern 25 may be removed by an ashing process, and then, the underlying layers may be sequentially etched using the linear spacer portion 23a and the spacer connecting portion 23b spaced apart from each other as an etch mask. The etching process may be performed in the same or similar manner as that of the example embodiments.

Figure 12A:
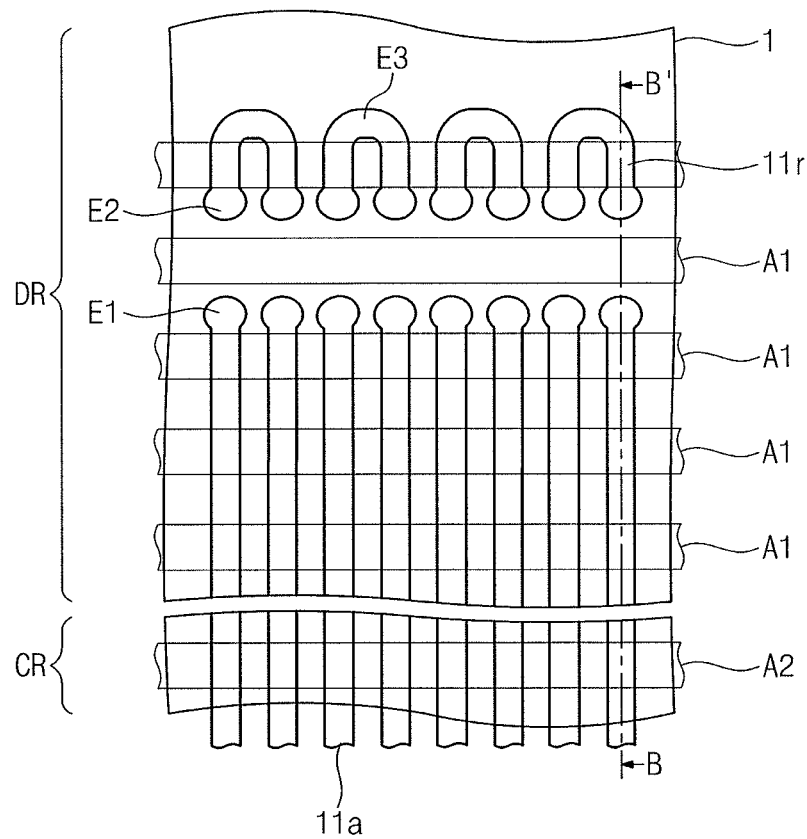
FIG. 12A illustrates a plan view of a semiconductor device according to other example embodiments.
Figure 12B:
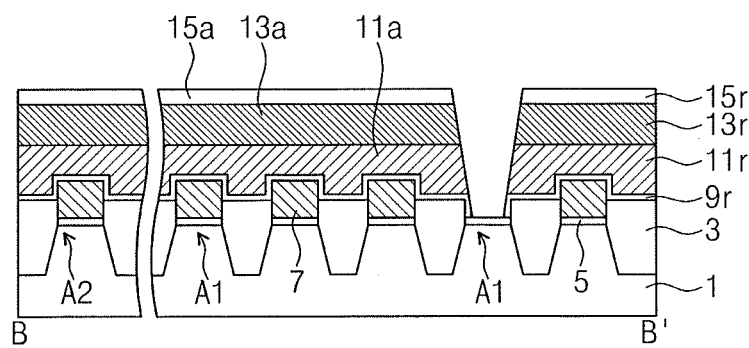
FIG. 12B illustrates a sectional view taken along line B-B' of FIG. 12A.

FIG. 12A illustrates a plan view of a semiconductor device according to other example embodiments. FIG. 12B illustrates a sectional view taken along line B-B' of FIG. 12A.

Referring to FIGS. 12A and 12B, in the semiconductor device according to other example embodiments, the width of, and the space between, the dummy active regions A1 may be substantially equivalent to those of the cell active regions A2. All of the first end-portion E1 of the word line 11a and the second end-portion and third end-portion E2 and E3 of the remaining word line patterns 11r may be provided on the device isolation layer 3. Except for this difference, the semiconductor device according to other example embodiments may be configured to have substantially the same or similar features as those of the previous embodiments.

Figure 13:
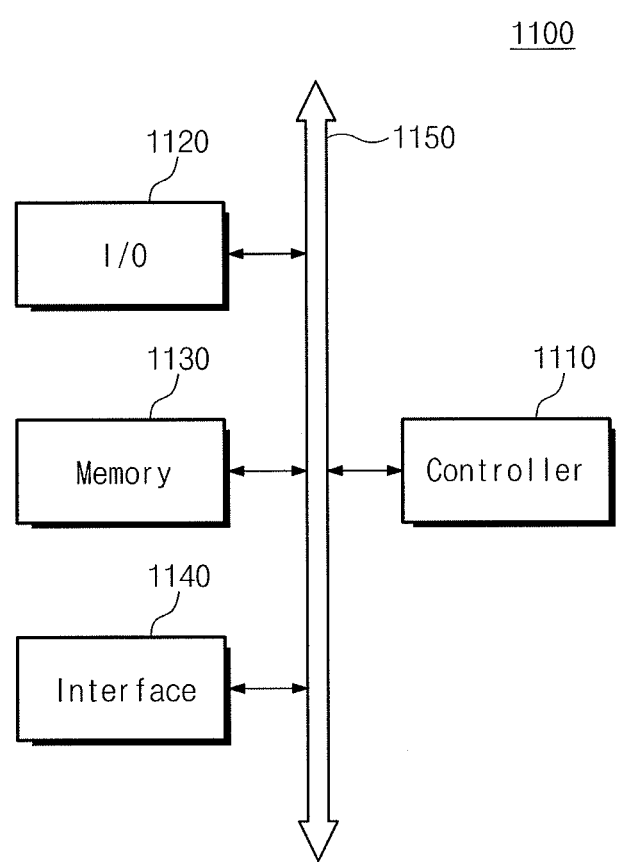
FIG. 13 illustrates a schematic block diagram illustrating an example of memory systems including semiconductor devices according to example embodiments.

FIG. 13 illustrates a schematic block diagram depicting an example of a memory system including a semiconductor device according to example embodiments.

Referring to FIG. 13, a memory system 1100 may be applied to a PDA (personal digital assistant), a portable computer, a web tablet, a wireless phone, a mobile phone, a digital music player, a memory card, and/or other devices that can transmit and/or receive data in a wireless communication environment.

The memory system 1100 may include a controller 1110, an input/output device 1120 (e.g., a keypad and/or a display device), a memory 1130, an interface 1140, and a bus 1150. The memory 1130 and the interface 1140 may communicate with each other through the bus 1150.

The controller 1110 may include a microprocessor, a digital signal processor, a micro controller, and/or other process devices similar to a microprocessor, a digital signal processor, or a micro controller. The memory 1130 may be used to store an instruction executed by the controller 1110. The input/output device 1120 may receive data and/or a signal from the outside of the system 1100 and/or transmit data and/or a signal to the outside of the system 1100. For example, the input/output device 1120 may include a keyboard, a keypad, and/or a displayer.

The memory 1130 may include a nonvolatile memory device that may include the semiconductor device according to example embodiments. The memory 1130 may further include other kinds of memory, for example, a volatile memory device capable of random access or various other kinds of memories.

The interface 1140 may transmit data to a communication network and/or may receive data from a communication network.

Figure 14:
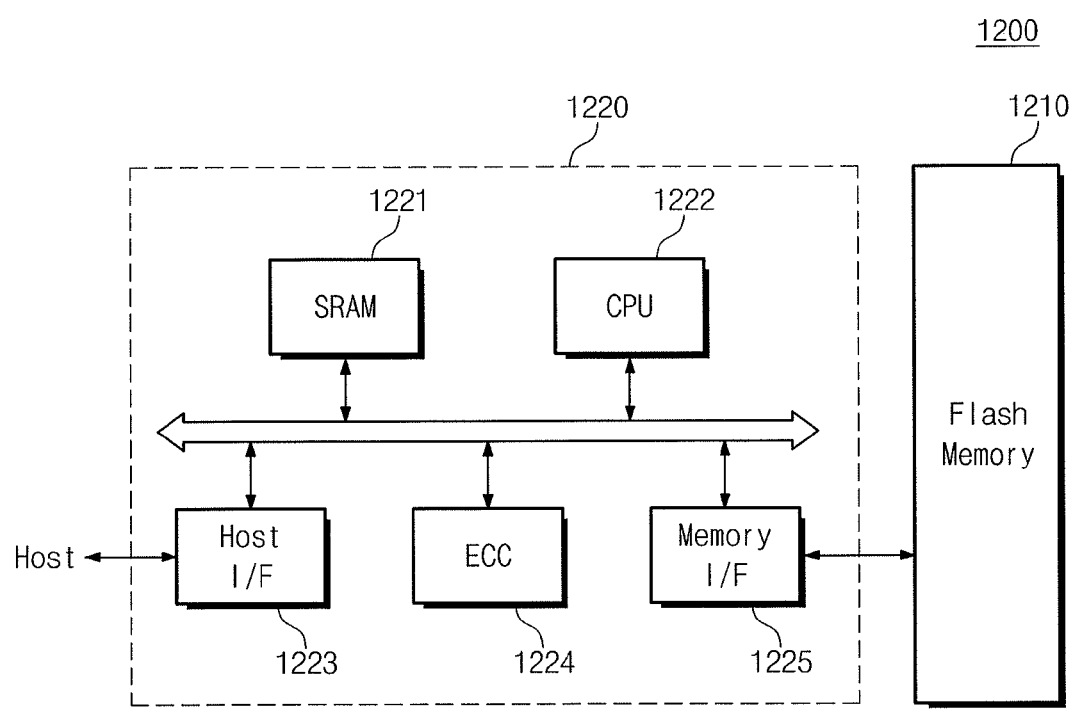
FIG. 14 illustrates a schematic block diagram illustrating an example of memory cards including semiconductor devices according to example embodiments.

FIG. 14 illustrates a schematic block diagram depicting an example of a memory card including a semiconductor device according to example embodiments.

Referring to FIG. 14, a memory card 1200 for supporting a storage capability of a large capacity may be fitted with a semiconductor memory device 1210, which may include a semiconductor device according to example embodiments. The memory card 1200 according to example embodiments may include a memory controller 1220 that may control data exchange between a host and the semiconductor memory device 1210.

A static random access memory (SRAM) 1221 may be used as an operation memory of a processing unit 1222. A host interface 1223 may include data exchange protocols of a host that may be connected to the memory card 1200. An error correction block 1224 may detect and/or may correct errors that may be included in data readout from a multi bit semiconductor memory device 1210. A memory interface 1225 may interface with the semiconductor memory device 1210 including a semiconductor device of at least some example embodiments. The processing unit 1222 may perform control operations for exchanging data of the memory controller 1220. That the memory card 1200 including a semiconductor device according to example embodiments may include a ROM (not illustrated) storing code data for interfacing with the host.

Figure 15:
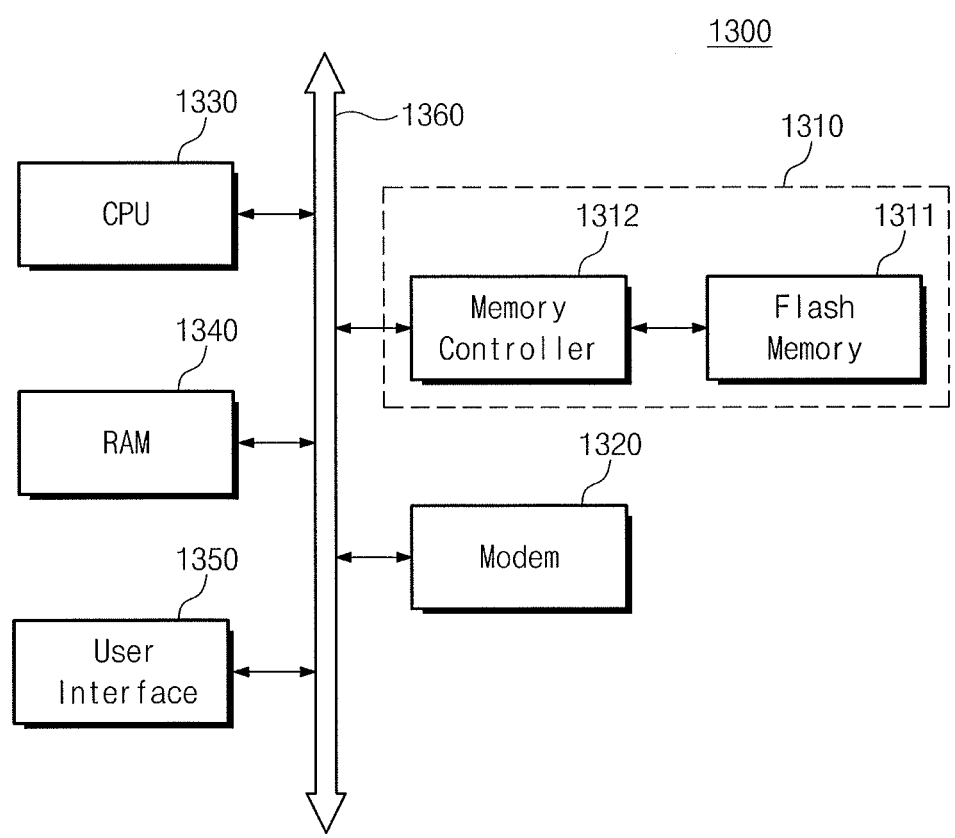
FIG. 15 illustrates a schematic block diagram illustrating an example of information processing systems including semiconductor devices according to example embodiments.

FIG. 15 illustrates a schematic block diagram depicting an example of an information processing system including a semiconductor device according to example embodiments.

Referring to FIG. 15, an information processing system 1300 may include a semiconductor memory system 1310 including a semiconductor memory device including a semiconductor device according to example embodiments. The semiconductor memory system 1310 may be mounted to an information processing system, for example, a mobile device and/or a desktop computer. The information processing system 1300 may also includes a modem 1320, a central processing unit (CPU) 1330, a RAM 1340, and a user interface 1350, which may be electrically connected to a system bus 1360. The semiconductor memory system 1310 may include a semiconductor memory device 1311, and a memory controller 1312. A memory system 1310 may be a solid state drive SSD, and data that may be processed by the CPU 1330 and/or input from the outside may be stored in the SSD. The information processing system 1300 configured as described and including a semiconductor memory device may reliably store a large amount of data in the semiconductor memory system 1310. The semiconductor memory system 1310 may conserve resources for error correction and a high speed data exchange function may be provided. The information processing system 1300 may also include an application chipset, a camera image processor (CIS) and/or an input/output device.

Furthermore, a semiconductor device and/or memory system that may include the same may be packaged in various kinds of ways. For instance, the semiconductor device and/or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP) configuration.

By way of summation and review, higher integration of semiconductor memory devices is desirable to satisfy consumer demands for superior performance and inexpensive prices. However, the extremely expensive process equipment needed to increase pattern fineness sets a practical limitation on increasing integration for semiconductor memory devices. To overcome such a limitation, a double patterning technology is proposed.

The double patterning technology may allow for manufacturers to achieve a small feature size that is beyond a resolution limitation of an exposure system. For example, according to such double patterning technology, the formation of fine pitch patterns may include forming sacrificial patterns through a photolithography process, forming spacers on sidewalls of the sacrificial patterns, removing the sacrificial patterns, and etching an etch target layer using the spacers as an etch mask. However, as integration density of the semiconductor device increases, more advanced patterning methods are desirable.

In addition, when carrying out a wet etching process to form word line patterns having a high density adjacent to a DAM structure, there may be difficulty in providing the etching solution due to the presence of the DAM structure. Accordingly, a polymer to be etched may not be sufficiently removed, and a bridge may occur at end portions of the word lines. If dry etching is used, an etch loading effect may occur, which may be caused by a spatial difference in pattern density. Here, also, a bridge may occur at end portions of the word lines, Embodiments provide a method in which a trim or cell node separation process is performed to a region provided in the same cell region and not to an end portion of the cell region. Accordingly, a trimmed structure may exist in the inner portion of the cell region, and a bridge may be prevented or avoided.

According to example embodiments, a semiconductor device may include lines and remaining line patterns, whose end-portions are provided to have symmetry with respect to each other. Accordingly, it may be possible to prevent a bridge from occurring between the lines.

According to example embodiments, a method of fabricating a semiconductor device may include a spacer trim process, in which a linear spacer spaced apart from a spacer connecting portion is partially removed. Accordingly, it may be possible to apply the same etching condition to both of the end-portion and the sidewall of the spacer and thereby to prevent a bridge from occurring between the lines. This method may also make it possible to prevent the bridge from occurring at end-portions of word lines of a NAND FLASH memory device. Further, even though the bridge occurs, it may be possible to confine a position of the bridge within a region between floating gates in a dummy active region, and thus, the memory device may be normally operated. As the result of the prevention of the bridge, it may be possible to increase a line width (or critical dimension) of the gate line and thereby to improve characteristics of memory cells.

Accordingly, embodiments provide a semiconductor device in which a bridge between conductive lines in prevented from occurring, and provide a method of fabricating a semiconductor device that prevents or avoids a bridge.

While example embodiments have been particularly shown and described, it will be understood by one of ordinary skill in the art that variations in form and detail may be made therein without departing from the spirit and scope of the attached claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a plurality of lines disposed on a semiconductor substrate; and
   remaining line patterns disposed spaced apart from the lines on extensions from the lines,
   wherein the lines include first end-portions adjacent to the remaining line patterns,
   the remaining line patterns include second end-portions adjacent to the lines,
   the first end-portions and second end-portions are formed to have mirror symmetry with respect to each other, and
   each of the first end-portions has a width greater than the lines.

2. The semiconductor device as claimed in claim 1, further comprising a device isolation layer disposed on the substrate to define a dummy active region and a cell active region,
   wherein the dummy active region is between the first end-portions and the second end-portions.

3. The semiconductor device as claimed in claim 2, wherein a width of the dummy active region is greater than that of the cell active region.

4. The semiconductor device as claimed in claim 1, wherein the remaining line patterns are spaced apart from each other.

5. The semiconductor device as claimed in claim 4, wherein:
   the remaining line patterns further include third end-portions spaced apart from the second end-portions, and
   widths of the second and third end-portions are greater than widths of the lines.

6. The semiconductor device of claim 1, wherein at least portions of the remaining line patterns are connected to each other.

7. A semiconductor device, comprising:
   a plurality of lines disposed on a semiconductor substrate; and
   remaining line patterns disposed spaced apart from the lines on extensions from the lines,
   wherein the lines include first end-portions adjacent to the remaining line patterns,
   the remaining line patterns include second end-portions adjacent to the lines,
   the first end-portions and second end-portions are formed to have mirror symmetry with respect to each other, and
   a sidewall slope of the first end-portions is more gentle than a sidewall slope of the lines.

8. The semiconductor device as claimed in claim 7, wherein each of the first end-portions has a width greater than the lines.

\* \* \* \* \*